United States Patent
Cho et al.

(10) Patent No.: US 12,548,736 B2
(45) Date of Patent: Feb. 10, 2026

(54) SUBSTRATE PROCESSING DEVICE, METHOD FOR PREPARING SUBSTRATE PROCESSING DEVICE, AND SUBSTRATE PROCESSING METHOD

(71) Applicant: JUSUNG ENGINEERING CO., LTD., Gwangju-si (KR)

(72) Inventors: Won Tae Cho, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 493 days.

(21) Appl. No.: 17/779,126

(22) PCT Filed: Dec. 4, 2020

(86) PCT No.: PCT/KR2020/017620
§ 371 (c)(1),
(2) Date: May 23, 2022

(87) PCT Pub. No.: WO2021/112611
PCT Pub. Date: Jun. 10, 2021

(65) Prior Publication Data
US 2022/0415613 A1    Dec. 29, 2022

(30) Foreign Application Priority Data
Dec. 4, 2019   (KR) .......................... 10-2019-0160177

(51) Int. Cl.
*C23C 16/455*   (2006.01)
*C23C 16/44*    (2006.01)
(Continued)

(52) U.S. Cl.
CPC ...... *H01J 37/3244* (2013.01); *C23C 16/4404* (2013.01); *C23C 16/45525* (2013.01);
(Continued)

(58) Field of Classification Search
None
See application file for complete search history.

(56) References Cited

U.S. PATENT DOCUMENTS 5,310,624 A  *  5/1994  Ehrlich ................. G03F 7/2006
                                              430/311
2002/0066532 A1     6/2002  Shih et al.
(Continued)

FOREIGN PATENT DOCUMENTS

JP    H07316820 A    12/1995
JP    6261974 B2     1/2018
(Continued)

OTHER PUBLICATIONS

Written Opinion for PCT/KR2020/017620, mailed Mar. 22, 2021.
International Search Report for PCT/KR2020/017620, mailed Mar. 22, 2021.

*Primary Examiner* — Alexander M Weddle
(74) *Attorney, Agent, or Firm* — Renaissance IP Law Group LLP

(57) ABSTRACT

Provided is an apparatus for processing a substrate, which includes a chamber having a processing space in which a process of depositing a thin-film on a substrate is performed and a structure which is installed to expose at least one surface to the processing space and in which a coating layer made of a polymer forming at least one of covalent bond and double bond at an end tail is formed on the surface exposed to the processing space.

Thus, the substrate processing apparatus in accordance with an exemplary embodiment may restrict or prevent particle generation and substrate pollution generation caused by a thin-film deposited in the chamber. Also, a period of cleaning the chamber and a structure or a component in the chamber may be extended. Thus, a product yield rate and an apparatus operation efficiency may improve.

9 Claims, 4 Drawing Sheets

(51) Int. Cl.
  *C23C 16/46* (2006.01)
  *H01J 37/32* (2006.01)
  *H01L 21/02* (2006.01)

(52) U.S. Cl.
  CPC ........ *C23C 16/46* (2013.01); *H01J 37/32724* (2013.01); *H01L 21/0228* (2013.01); *H01J 2237/332* (2013.01)

(56) References Cited

U.S. PATENT DOCUMENTS

2014/0377963 A1* 12/2014 Ellinger ............ H01L 21/02422
  438/763
2018/0155823 A1* 6/2018 Matsumoto ........... C23C 16/042
2019/0264314 A1 8/2019 Gopalan et al.

FOREIGN PATENT DOCUMENTS

| | | | |
|---|---|---|---|
| KR | 100332314 | B1 | 4/2002 |
| KR | 100518676 | B1 * | 10/2005 |
| KR | 101028605 | B1 | 4/2011 |
| KR | 101090895 | B1 | 12/2011 |
| TW | 201406877 | A | 2/2014 |
| TW | 201631204 | A | 9/2016 |
| TW | 201804028 | A | 2/2018 |

* cited by examiner

200 : 210, 220, 230
300 : 310, 320, 330
400 : 410 , 420, 430
500 : 510, C
510 : 511, 511a, 512, 513, 514, 515a, 515b, 516

SUBSTRATE PROCESSING DEVICE, METHOD FOR PREPARING SUBSTRATE PROCESSING DEVICE, AND SUBSTRATE PROCESSING METHOD

BACKGROUND

The present disclosure relates to an apparatus for processing a substrate processing device, a method for preparing substrate processing device, and a substrate processing method, and more particularly, to an apparatus for processing a substrate, which is capable of extending a cleaning period, a method for preparing the same, and a method for processing a substrate.

In general, a semiconductor device is manufactured by depositing various materials on a substrate in the form of a thin-film and then pattering the thin-film. To this end, various different processes such as a deposition process, an etching process, a cleaning process, and a drying process are performed. Here, the deposition process is performed for forming a thin-film having a property required as the semiconductor device on the substrate. However, by-products including a deposited material are deposited on not only a desired area of the substrate but also an inside area of the chamber in which the deposition process is performed during the process for depositing the thin-film.

Also, when a thickness of the by-products deposited in the chamber increases, the by-products are delaminated to generate particles. Also, the particles may move into the thin-film formed on the substrate or be attached to a surface of the thin-film to cause a defect, thereby increasing a defect rate of a product. Thus, the by-products deposited in the chamber are necessarily removed before the by-products are delaminated.

Thus, a process of cleaning the inside of the chamber is generally performed after the deposition process is performed a plurality of times. However, when the cleaning process has a short period, a product yield rate and an apparatus operation efficiency may decrease.

RELATED ART DOCUMENT

Patent Document (Patent document 1) Korean Patent Registration No. KR0332314

SUMMARY

The present disclosure provides an apparatus for processing a substrate, which is capable of extending a cleaning period, a method for preparing the same, and a method for processing a substrate.

The present disclosure also provides an apparatus for processing a substrate, which is capable of restricting a material from being deposited on a surface during a substrate processing process, a method for preparing the same, and a method for processing a substrate.

In accordance with an exemplary embodiment, an apparatus for processing a substrate includes: a chamber having a processing space in which a process of depositing a thin-film on a substrate is performed; and a structure which is installed to expose at least one surface to the processing space and in which a coating layer made of a polymer forming at least one of covalent bond and double bond at an end tail is formed on the surface exposed to the processing space.

The coating layer may be made of a polymer without at least one functional group of a hydroxyl group (—OH) and an amino group (—NH) at an end tail.

The coating layer may be made of at least one of poly (methyl methacrylate) (PMMA), poly(tert-butyl methylacrylate) (PtBMA), poly(vinyl pyrrolidone) (PVP), poly (methyl methacrylamide) (PMAM), and polystyrene-block-poly(methyl methacrylate) (PS-b-PMMA).

The structure may include a base made of at least one of metal and alloy and having at least one surface exposed to the processing space, and the coating layer may be applied on the at least one surface expose to the processing space in the surface of the base.

The chamber may include a body having the processing space and a wall member mounted to and separated from an inner wall of the body, the structure may include at least one of the wall member, a susceptor installed in the processing space and on which the substrate is seated, and an injection unit disposed to face the susceptor and configured to inject a material for depositing a thin-film toward the susceptor, and each of the wall member, the susceptor, and the injection unit may be separated from the chamber to the outside.

When a thin-film is deposited on the substrate, an inner temperature of the chamber may be adjusted to 450° C. or less.

The apparatus for processing the substrate may deposit the thin-film on the substrate by an atomic layer deposition method (ALD).

In accordance with another exemplary embodiment, a method for preparing an apparatus for processing a substrate, which deposits a thin-film on a substrate, includes forming a coating layer, which is made of a polymer forming one of covalent bond and double bond at an end tail, on at least one of a surface of a chamber exposed to a processing space and a surface of a component installed in the processing space in the chamber having the processing space in which the thin-film is deposited on the substrate.

The coating layer may be made of a polymer without at least one functional group of a hydroxyl group (—OH) and an amino group (—NH) at an end tail.

The coating layer may be made of at least one of poly (methyl methacrylate) (PMMA), poly(tert-butyl methylacrylate) (PtBMA), poly(vinyl pyrrolidone) (PVP), poly (methyl methacrylamide) (PMAM), and polystyrene-block-poly(methyl methacrylate) (PS-b-PMMA).

When the coating layer is formed, the coating layer may be formed on at least one of a wall member of the chamber, which surrounds the processing space, a support body installed in the processing space and on which the substrate is seated, and an injection body disposed to face the support body to inject a material for depositing a thin-film toward the support body.

In accordance with yet another exemplary embodiment, a method for processing a substrate in an apparatus for processing a substrate in which a coating layer, which is made of a polymer forming one of covalent bond and double bond at an end tail, is formed on at least one of a surface of a chamber exposed to a processing space and a surface of a component installed in the processing space in the chamber having the processing space in which a thin-film is deposited on a substrate includes depositing a thin-film on the substrate by loading a substrate into the processing space and injecting a material for a deposition process into the processing space.

The coating layer may be made of at least one of poly (methyl methacrylate) (PMMA), poly(tert-butyl methylacrylate) (PtBMA), poly(vinyl pyrrolidone) (PVP), poly (methyl methacrylamide) (PMAM), and polystyrene-block-poly(methyl methacrylate) (PS-b-PMMA).

The depositing of the thin-film on the substrate may be performed at a temperature of 450° C. or less by an atomic layer deposition method (ALD).

The depositing of the thin-film on the substrate by the atomic layer deposition method (ALD) may include: injecting a source material gas into the processing space; and injecting a reaction material gas that reacts with the source material gas into the processing space. Here, the reaction material gas may use at least one of ozone ($O_3$), ammonia ($NH_3$), $H_2O$, hydrogen peroxide ($H_2O_2$), nitrous oxide ($N_2O$), and hydrogen ($H_2$).

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
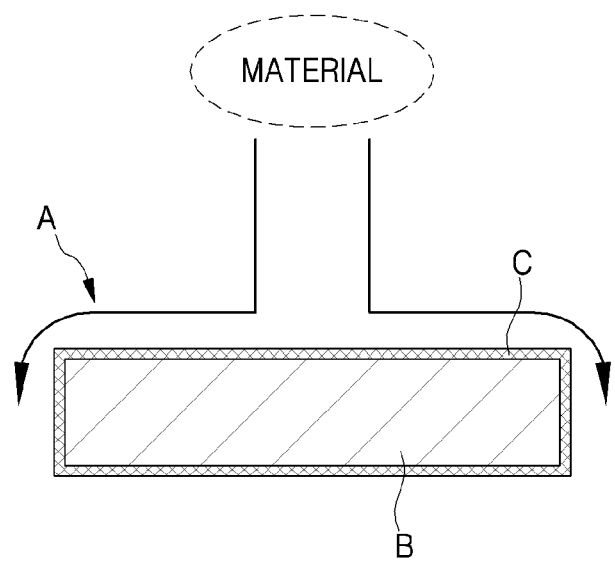
FIG. 1 is a conceptual view illustrating a structure in which a coating layer is formed in accordance with an exemplary embodiment.

Hereinafter, specific embodiments will be described in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout.

An exemplary embodiment relates to an apparatus for processing a substrate (hereinafter, referred to as a substrate processing apparatus), which is capable of extending a cleaning period by restricting a material from being deposited on an inner surface during a process of processing a substrate. More particularly, an exemplary embodiment provides a substrate processing apparatus in which a surface is treated so that a material or a reaction product (hereinafter, referred to as a reactant) injected for the process of processing the substrate is not adsorbed or is not easily adsorbed to the surface, and the material and the reactant is not chemically bonded to or does not react with the surface.

FIG. 1 is a conceptual view illustrating a structure in which a coating layer is formed in accordance with an exemplary embodiment.

A structure A in accordance with an exemplary embodiment includes a base B and a coating layer C formed or applied on a surface of the base B. Here, the base B may be made of metal, e.g., aluminum (Al). However, the exemplary embodiment is not limited to the material of aluminum (Al). For example, the base B may be made of various metal or alloys.

The structure A may be a structure or a component for constituting the substrate processing apparatus. More particularly, the structure A may be a space for accommodating a substrate that is an object to be processed, or a structure or a component that is exposed to a space (hereinafter, referred to as a reaction space) to which a material for depositing a thin-film on the substrate is injected or accommodated in the reaction space.

Thus, the base B may be a body of the structure or the component that is exposed to the reaction space or accommodated in the reaction space among structures or components constituting the substrate processing apparatus, and the structure A may be manufactured by forming the coating layer C on the surface of the base B.

When the coating layer C is formed on the surface of the base B, the coating layer C may be formed on the entire surface of the base B or on a portion of the surface of the base B. When the coating layer C is formed on a portion of the surface of the base B, the coating layer C may be formed on at least a surface exposed to the reaction space.

Figure 2:
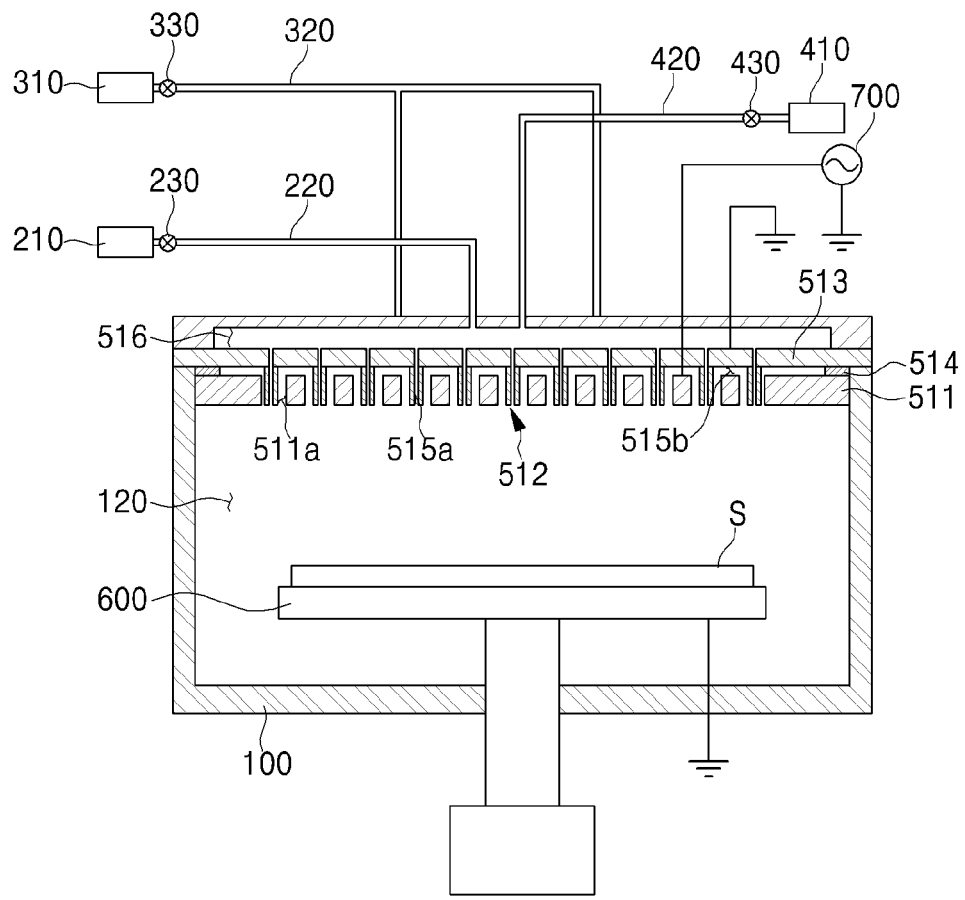
FIG. 2 is a view illustrating an apparatus for processing a substrate with the structure applied in accordance with an exemplary embodiment.
Figure 3:
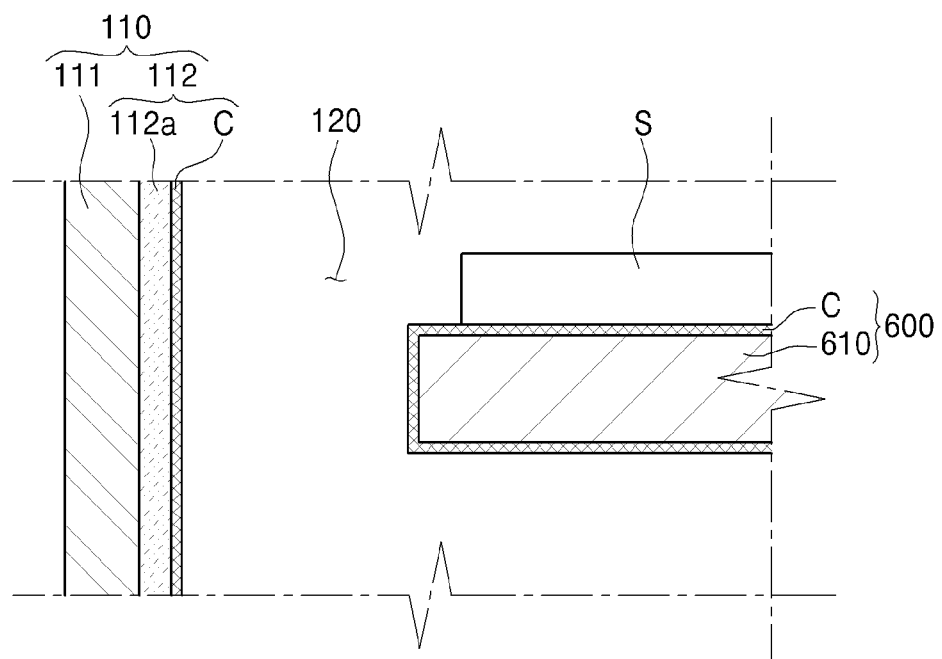
FIG. 3 is a partial enlarged view illustrating a chamber and a susceptor on which a coating layer is formed in accordance with an exemplary embodiment.
Figure 4:
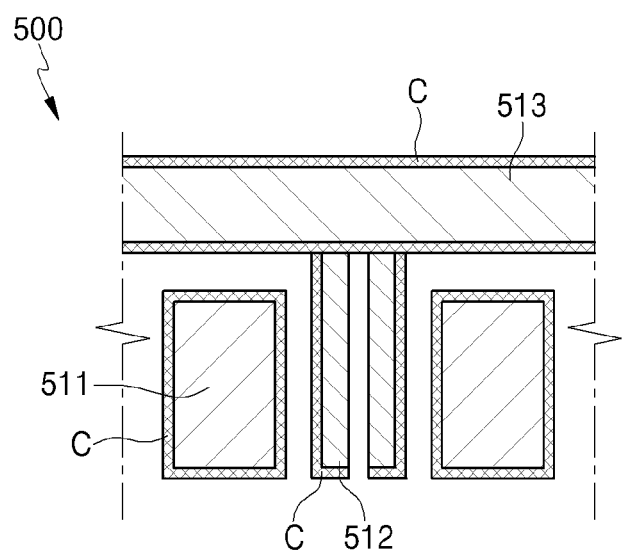
FIG. 4 is a partial enlarged view illustrating an injection unit on which a coating layer is formed in accordance with an exemplary embodiment.

FIG. 2 is a view illustrating the substrate processing apparatus applied with the structure in accordance with an exemplary embodiment. FIG. 3 is a partial enlarged view illustrating a chamber and a susceptor, on which a coating layer is formed, in accordance with an exemplary embodiment. FIG. 4 is a partial enlarged view illustrating an injection unit on which a coating layer is formed in accordance with an exemplary embodiment.

Hereinafter, the substrate processing apparatus applied with the structure in accordance with an exemplary embodiment will be described with reference to FIGS. 2 to 4.

The substrate processing apparatus may form a thin-film on a substrate S by an atomic layer deposition method (ALD). More particularly, the substrate processing apparatus may deposit a thin-film on the substrate S by the atomic layer deposition method (ALD) under a temperature condition equal to or less than 450° C. Also, the substrate processing apparatus may perform wet cleaning.

Referring to FIG. 2, the substrate processing apparatus in accordance with an exemplary embodiment includes a chamber 100, first to third gas supply units 200, 300, and 400, a first path 515a through which gases supplied from the first and third gas supply units 200 and 400 move, a second path 515b through which a gas supplied from the second gas supply unit 300 moves, an injection unit 500 installed in the chamber 100 to inject a gas, and a susceptor 600 installed in the chamber 100 to face the injection unit 500 and on which the substrate S is seated on one surface facing the injection unit 500.

Also, the substrate processing apparatus may include a RF power unit 700 applying a power for generating plasma in the chamber 100.

Referring to FIG. 3, the chamber 100 includes a main body 110 having a processing space 120 in which a thin-film is formed on the substrate S loaded into the chamber 100. The main body 110 may include a body 111 forming an overall outer shape of the chamber 100 and a plurality of walls 112 capable of being mounted to or separated from an inner wall of the body 111.

The body 111 may include a side wall disposed at an outer circumference of each the injection unit 500 and the susceptor 600, an upper wall connected to an upper portion of the side wall, and a lower wall connected to a lower portion of the side wall. Also, the body 111 may be made of metal such as a material containing aluminum (Al).

A wall 112 may be mounted to an inner surface of each of the side wall, the upper wall, and the lower wall of the body 111, and the wall 112 may be separated from the body 111.

As described above, the main body 110 includes the body 111 and the wall 112 that is separable from the body 111 to easily clean the chamber 100. That is, when the chamber 100 is cleaned, only the wall 112 exposed to the processing space 120 is separated and cleaned instead of cleaning the entire main body 110.

Also, the chamber 100 may be provided as the structure A in accordance with an exemplary embodiment. That is, the chamber 100 may include the coating layer C formed on the inner surface exposed to the processing space 120.

More specifically, the wall 112 of the chamber 100 may include a wall member 112a and a coating layer C formed on a surface of the wall member 112a. Also, the wall member 112a of the chamber 100 may correspond to the base B of the structure A.

The wall member 112a may be made of metal such as a material containing aluminum (Al). Also, the coating layer C may be formed on the entire surface of the wall member 112a or a surface facing the processing space 120 or exposed to the processing space 120.

As described above, since the coating layer C is formed on the surface exposed to the processing space 120 in the wall member 112a constituting the chamber 100, it may be described that the coating layer C is formed on an inner surface of the chamber 100.

The coating layer C may be made of a material that does not react with another material or has a low reaction force with another material. In other words, the coating layer C is made of a material to which another material is not adsorbed or not easily adsorbed and which is not chemically bond to another material or dose not react with another material. The coating layer C will be described in detail later.

The injection unit 500 may inject a gas to the inside of the chamber 100, i.e., the processing space 120, for processing a substrate, i.e., depositing a thin-film. The injection unit 500 includes an injection body 510 having a path 515a and 515b allowing a gas introduced into the chamber to pass therethrough and be injected into the chamber 100. Also, the injection unit 500 may include a coating layer C formed on a surface of the injection body 510.

For example, the injection body 510 may be disposed to face the susceptor 600 in the chamber 100 and include a first plate 511 in which holes (hereinafter, referred to as injection holes 511a) are arranged and spaced apart from each other in an extension direction of the susceptor 600 and a plurality of nozzles 512 to which a plurality of injection holes 511a are inserted, respectively.

Also, the injection body 510 may include a second plate 513 disposed between the first plate 511 and the upper wall in the chamber 100 and an insulation part 514 disposed between the first plate 511 and the second plate 513.

Here, the first plate 511 may be connected to the RF power unit 700, and the second plate 513 may be grounded. Also, the insulation part 514 may serve to prevent an electrical connection between the first plate 511 and the second plate 513.

The first plate 511 may have a plate shape extending in the extension direction of the susceptor 600. Also, when the plurality of injection holes 511a are defined in the first plate 511, each of the plurality of injection holes 511a pass through the first plate 511 in a vertical direction. The plurality of injection holes 511a are arranged in the extension direction of the susceptor 600 or the first plate 511.

Each of the plurality of nozzles 512 may have a shape extending in the vertical direction, a passage through which a gas passes is defined in each thereof, and an upper end and a lower end thereof are opened. Also, each of the plurality of nozzles 512 has a lower portion inserted to the injection hole 511a defined in the first plate 511 and an upper portion connected to the second plate 513. Thus, the nozzle 512 may have a shape protruding downward from the second plate 513.

When the nozzle 512 has an outer diameter less than an inner diameter of the injection hole 511a and is inserted into the injection hole 511a, an outer circumferential surface of the nozzle 512 is spaced apart from a peripheral wall (i.e., an inner wall of the first plate 511) of the injection hole 511a. Thus, the inside of the injection hole 511a is divided into an outer space and an inner space of the nozzle 512.

The passage in the nozzle 512 in the injection hole 511a is a passage through which gases supplied from the first and third gas supply units 200 and 400 move and are injected. Also, the outer space of the nozzle 512 in the injection hole 511a is a passage through which a gas supplied from the second gas supply unit 300 moves and is injected.

Thus, hereinafter, the passage in the nozzle 512 is referred to as a first path 515a, and the outer space of the nozzle 512 in the injection hole 511a is referred to as a second path 515b.

The second plate 513 may have a top surface spaced apart from the upper wall in the chamber and a bottom surface spaced apart from the first plate 511. Thus, an empty space is defined between the second plate 513 and the first plate 511 and the second plate 513 and the upper wall of the chamber 100.

Here, the upper space of the second plate 513 is a space (hereinafter, referred to as a gas diffusion space 516) to which the gases supplied from the first and third gas supply units 200 and 400 are diffused. The gas diffusion space 516 is communicated with upper openings of the plurality of nozzles 512. In other words, the gas diffusion space 516 is communicated with the plurality of first paths 515a. Thus, the gas supplied from the first and third gas supply units 200 and 400 to the gas diffusion space 516 is supplied and injected to the plurality of first paths 515a.

Also, a gun drill (not shown) that is a passage through which a gas moves is defined in the second plate 513, and the gun drill is connected to a second transfer pipe 320 of the second gas supply unit 300, which will be described later, and communicated with the second path 515b. Thus, the gas supplied from the second gas supply unit 300 may be injected to the substrate S through the second path 515b and the gun drill of the second plate 513.

The above-described injection body 510 may be made of metal such as a material containing aluminum (Al).

Also, the first and second plates 511 and 513, the nozzle 521, and the insulation part 514, which constitute the injection body 510, may be coupled to and separated from each other. Also, each of the first plate 511 and the second plate 513 may be divided in a plurality of components instead of a single body, and the plurality of components may be coupled to each other.

As the injection body 510 may be separated from each other as described above, the injection unit 500 may be separated from the chamber 100, and the injection unit 500 may be easily cleaned.

However, the exemplary embodiment is not limited to the above-described injection body 510. For example, the injection body 510 may have various configurations and shapes capable of injecting the gas for depositing a thin-film into the chamber 100.

The injection unit 500 may be provided as the structure A in accordance with an exemplary embodiment. That is, the injection unit 500 may include an injection body 510 and a coating layer C formed on the surface of the injection body 510 (refer to FIG. 4). Here, the injection body 510 of the injection unit 500 may correspond to the base B of the structure A.

When the coating layer C is formed on the surface of the injection body 510, the surface may be exposed to at least the processing space 120 of the chamber 100.

The surface of the injection body 510 may represent an outer surface and an inner surface of each of the first plate 511, the second plate 513, the nozzle 512, and the insulation part 514. That is, the surface of the injection body 510 includes a top surface and a bottom surface of the first plate 511, an inner surface of the first plate 511, which divides or surrounds the injection hole 511a, a top surface and a bottom surface of the second plate 513, and an outer surface of the nozzle 512.

Also, the coating layer C may be formed on the entire surface of the injection body 510 or a portion of the surface of the injection body 510. When the coating layer C may be formed on a portion of the surface of the injection body 510, the coating layer C may be formed on the surface exposed to the processing space 120 of the chamber 100. For example, the coating layer C may be formed on at least one of the top surface and the bottom surface of the first plate 511, the inner surface surrounding the injection hole 511a, the bottom surface of the second plate 513, the outer surface of the nozzle 512, and a side surface of the insulation part 514.

Hereinafter, the first to third gas supply units 200, 300, and 400 will be described. Here, for convenience of description, a gas supplied from the first gas supply unit 200 is referred to as a first gas, and a gas supplied from the second gas supply unit 300 is referred to as a second gas, and a gas supplied from the third gas supply unit 400 is referred to as a third gas.

The first gas supply unit 200 includes a first storage 210 in which the first gas is stored and a first transfer pipe 220 having one end connected to the first storage 210 and the other end connected to the gas diffusion space 516 and in which a passage through which the first gas moves is defined. Thus, the first gas supplied from the first storage 210 may move and be injected to pass through the gas diffusion space 516 and the plurality of nozzles 512, i.e., the plurality of first paths 515a.

The first gas stored in the first storage 210 may be a source material gas for forming a thin-film on the substrate S. For example, the first gas may include a source gas containing aluminum (Al), a source gas containing titanium (Ti), and a source gas containing tin (Sn).

Here, the source gas containing aluminum (Al), the source gas containing titanium (Ti), and the source gas containing tin (Sn) may be stored in one first storage 210, or as the one first storage 210 is divided into three storages, the source gas containing aluminum (Al), the source gas containing titanium (Ti), and the source gas containing tin (Sn) may be stored in the three storages, respectively.

Here, TMA(trimethylaluminum, $A(CH_3)_3$) may be used as the source gas containing aluminum (Al), TDEAT(Tetrakis Diethylamido Titanium, $Ti[N(C_2H_5)_2]_4$) may be used as the source gas containing titanium (Ti), and TMT(Tetramethyl Tin) may be used as the source gas containing tin (Sn).

However, the exemplary embodiment is not limited to the kind of the first gas. For example, the first gas may include a source gas containing different metal in addition to the source gas containing aluminum (Al), the source gas containing titanium (Ti), and the source gas containing tin (Sn).

The first transfer pipe 220 may allow the first gas supplied from the first storage 210 to move through the first path 515a. That is, during a deposition process, the first gas supplied from the first storage 210 moves to the plurality of nozzles 512 through the first transfer pipe 220 and the gas diffusion space 516. The first transfer pipe 220 may have a pipe shape having an inner passage through which a gas may move.

Also, a valve 230 controlling communication between the first storage 210 and the first transfer pipe 220 and adjusting a gas transfer amount may be installed.

The second gas supply unit 300 includes a second storage 310 in which the second gas is stored and a second transfer pipe 320 having one end connected to the second storage 310 and the other end connected to the gun drill disposed in the second plate 513 and in which a passage through which the second gas moves is defined. Thus, the second gas supplied from the second storage 310 may pass through the second transfer pipe 320 and the gun drill of the second plate 513 and then be injected through the second path 515b defined in the first plate 511.

The second gas stored in the second storage 310 may be a reaction material gas generating a reactant for reacting with the first gas to deposit a thin-film. That is, the second gas may be a different gas from the first gas and a reaction material gas capable of reacting with the first gas. For example, the second gas may use at least one of ozone ($O_3$), ammonia ($NH_3$), $H_2O$, hydrogen peroxide ($H_2O_2$), nitrous oxide ($N_2O$), and hydrogen ($H_2$).

The second transfer pipe 320 may allow the second gas supplied from the second storage 310 to move through the second path 515b. That is, the second gas supplied from the second storage 310 may pass through the second transfer pipe 320 and the gun drill of the second plate 513 and then move to the second path 515b. Thereafter, the second gas may be injected to the substrate S through the second path 515b.

The second transfer pipe 320 may have a pipe shape having an inner passage through which a gas may move or a gun drill shape forming a long linear hole in the second plate 513 of the chamber 100 for a gas to flow therein.

Also, a valve 330 controlling communication between the second storage 310 and the second transfer pipe 320 and adjusting a gas transfer amount may be installed.

The third gas supply unit 400 includes a third storage 210 in which the third gas is stored and a third transfer pipe 420 having one end connected to the third storage 410 and the other end connected to the gas diffusion space 516 and in which a passage through which the third gas moves is defined. Thus, the third gas supplied from the third storage 410 may move and be injected to pass through the gas diffusion space 516 and the plurality of nozzles 512, i.e., the plurality of first paths 515a.

The third storage 410 stores a gas for purging (hereinafter, referred to as a purge gas) during the thin-film deposition process. The purge gas stored in the third storage 410 may be an inert gas, e.g., a nitrogen gas.

The third transfer pipe 420 may allow the third gas, i.e., the purge gas, supplied from the third storage 410 to move to the injection unit 500. That is, during the thin-film deposition process, the third gas supplied from the third storage 410 moves to the plurality of nozzles 512 through the third transfer pipe 420 and the gas diffusion space 516.

The third transfer pipe 420 may have a pipe shape having an inner passage through which a gas may move. Also, a valve 430 controlling communication between the third storage 410 and the third transfer pipe 420 and adjusting a gas transfer amount may be installed.

The susceptor 600 may be disposed to face or disposed opposite to the injection unit 500 in the chamber 100. For example, the susceptor 600 may be disposed below the injection unit 500 in the chamber 100. The susceptor 600 may have a shape corresponding to that of the substrate S, e.g., a rectangular shape or a circular shape. Also, the susceptor 600 may have an area greater than that of the substrate S. Also, the susceptor 600 may include a heater (not shown) and a cooling unit (not shown) therein, and at least one of the heater and the cooling unit operates to adjust a temperature of each of the susceptor 600 and the substrate S to a target temperature.

The susceptor 600 may be provided as the structure A in accordance with an exemplary embodiment. That is, the susceptor 600 may include a coating layer C formed on a surface thereof. More particularly, the susceptor 600 may include a support body 610 disposed to face the injection unit 500 and a coating layer C applied on a surface of the support body 610.

Here, the surface of the support body 610 may include one surface (e.g., a top surface) facing the injection unit 500, the other surface (e.g., a bottom surface) opposite to the one surface, and a side surface connecting the one surface and the other surface. Also, the coating layer C may be formed on the entire surface or a portion of the surface of the support body 610.

The support body 610 may be made of metal such as a material containing aluminum (Al).

The RF power unit 700 may apply a power for generating plasma in the chamber 100. More particularly, the RF power unit 700, as a unit for applying a RF power for generating plasma, may be connected to the first plate 511 of the injection unit 500. Also, the RF power unit 700 may include an impedance matching circuit for matching load impedance and source impedance of the power for generating plasma. The impedance matching circuit may include two impedance devices constituted by at least one of a variable capacitor and a variable inductor.

Also, each of the second plate 513 and the susceptor 600 facing the injection unit 500 may be grounded.

Thus, when the RF power unit 700 applies the RF power to the first plate 511, and the susceptor 600 and the second plate 513 are grounded, plasma may be generated in the space between the susceptor 600 and each of the second path 515b and the first plate 511 in the injection unit 500.

Here, when plasma is generated in the space between the first plate 511 and the susceptor 600, the plasma is generated closer to the injection unit 500 than the susceptor 600. More particularly, the plasma is generated directly below the injection unit 500.

Hereinafter, a method for forming a thin-film on the substrate by using the above-described substrate processing apparatus will be simply described.

First, the substrate S is loaded into the chamber 100 and seated on the susceptor 600.

Thereafter, the substrate seated on the susceptor 600 is heated at a temperature equal to or less than 450° C., and a thin-film is formed on the substrate S by an atomic layer deposition method (ALD).

To this end, a gas for depositing a thin-film is injected into the chamber 100 by using the injection unit 500. For example, one cycle of 'the first gas (the source material gas)-the second gas (the reaction material gas)-the third gas (the purge material gas)' is performed a plurality of times. Thus, a reactant produced by reaction between the first gas and the second gas is deposited on the substrate S to form a thin-film. Here, when the first gas is a material containing aluminum (Al), and the second gas is a material containing oxygen (O), the first gas and the second gas react to produce aluminum oxide ($Al_2O_3$) to form the thin-film made of the aluminum oxide ($Al_2O_3$).

Thereafter, when the thin-film is completely formed on the substrate S, the substrate S is unloaded from the chamber 100.

When the above-described deposition process is performed a plurality of times, the thin-film may be deposited as the reactant between the first gas and the second gas is adsorbed or reacts the surface exposed to the reaction space of the chamber in the substrate processing apparatus. For example, the aluminum oxide ($Al_2O_3$) thin-film may be formed on the inner surface of the chamber 100, the surface of the injection unit 500, and the surface of the susceptor 600.

However, as illustrated in FIGS. 3 and 4, the substrate processing apparatus in accordance with an exemplary embodiment may have the coating layer C formed on at least one of the inner surface of the chamber 100, the surface of the injection body 510, and the surface of the support body 610.

The coating layer C may be made of a material to which another material is not adsorbed or not easily adsorbed and which is not chemically bond to another material or dose not react with another material. More particularly, the coating layer C may be made of a material to which another material is not adsorbed or not easily adsorbed and which is not chemically bond to another material or dose not react with another material at a temperature of 450° C. or less.

Further more particularly, the coating layer C may be made of a material to which a reactant produced by materials or the source material injected into the chamber 100 for depositing the thin-film on the substrate is not adsorbed or not easily adsorbed and which is not chemically bond to the reactant or dose not react with the reactant at the temperature of 450° C. or less.

Also, the coating layer is made of a material that is not dissociated or debonded at the temperature of 450° C. or less.

In an exemplary embodiment, the coating layer may be made of a material in which an end tail forms covalent bond or double bond in a chemical formula instead of having at least one functional group of a hydroxyl group (—OH) and an amino group (—NH) at the end tail.

More particularly, the coating layer may be made of a polymer in which an end tail forms covalent bond or double bond instead of having at least one functional group of a hydroxyl group (—OH) and an amino group (—NH) at the end tail. Also, the coating layer may be made of a material that is not dissociated or debonded at the temperature of 450° C. or less.

As a specific example, the coating layer C is formed of at least one material of poly(methyl methacrylate) (PMMA), poly(tert-butyl methylacrylate) (PtBMA), poly(vinyl pyrrolidone) (PVP), poly(methyl methacrylamide) (PMAM), and polystyrene-block-poly(methyl methacrylate) (PS-b-PMMA).

The feature of forming the coating layer by using a material that dose not have the hydroxyl group (—OH) and the amino group (—NH) at the end tail is performed because the hydroxyl group (—OH) and the amino group (—NH) easily react with the reactant or the material injected into the chamber 100 for depositing the thin-film on the substrate and are chemically bonded with the same. Particularly, the hydroxyl group (—OH) and the amino group (—NH) easily react with a precursor that is the source material gas injected into the chamber 100 for depositing the thin-film or a reactant between the source gas and the reaction material gas and are chemically bonded with the same.

However, in case of the material that dose not have the functional group of the hydroxyl group (—OH) and the amino group (—NH) at the end tail, another material is not adsorbed or not easily adsorbed to the end tail, and is not chemically bonded to or does not react the material. Thus, the precursor that the source material gas injected into the chamber 100 for depositing the thin-film is not adsorbed or not easily adsorbed to the material, and the material is not chemically bonded or does not react with the precursor.

Also, the covalent bond or the double bond requires great binding energy that is greater than that of single bond such as the hydroxyl group (—OH) and the amino group (—NH). Also, as the binding energy increases, the bonding is stable. Thus, in case of the material in which the end tail forms the covalent bond or the double bond, another material is not adsorbed or not easily adsorbed to the end tail, and the material is not chemically bonded or dose not react with another material.

Thus, in the structure or the component constituting the substrate processing apparatus, the coating layer C is formed by applying the material which is formed on the surface exposed to the processing space to which another material is not adsorbed or not easily adsorbed and which is not chemically bonded or dose not react with another material. Thus, the substrate processing apparatus may have surfaces to which another material is not adsorbed or not easily adsorbed and which is not chemically bonded or dose not react with another material.

The material forming the coating layer may be in a paste, liquid, or film state having a predetermined viscosity.

When the thin-film is deposited on the substrate S in the chamber 100, the process may be performed at a temperature of 350° C. or less, more particularly, a temperature in a range from 100° C. to 300° C. or a temperature greater than 350° C. and equal to or less than 450° C.

In case of the structure A applied to the substrate processing apparatus for depositing the thin-film under a temperature condition of 350° C. or less, the coating layer may be formed by using a material for forming a coating layer in a paste or liquid state. Also, the material for forming the coating layer in the paste or liquid state may be injected or applied on the base B by a spin coating method, a spray coating method, or an evaporation method. Also, after the material for forming the coating layer is injected or applied on the surface of the base B, the injected or applied material may be cured by a thermal curing method or a photo-curing method, thereby forming the coating layer. Here, when cured by the thermal curing method, a temperature is adjusted to be equal to or less than 350° C. Also, when cured by the photo-curing method, UV-light may be used, and when the UV-light is used, a temperature equal to or less than 350° C. may be maintained.

For another example, in case of the structure A applied to the substrate processing apparatus for depositing the thin-film under a temperature condition of 450° C. or less, the coating layer may be formed by using a material for forming a coating layer in a film state. Also, the coating layer may be formed by a method of attaching or laminating the material for forming the coating layer in the film state on the surface of the base B.

Also, the coating layer C may have a thickness in a range from 1000 Å(100 nm) to 10000 Å(1000 nm).

In an exemplary embodiment, a deposition process for depositing the thin-film on the substrate is performed by using the above-described substrate processing apparatus in which surfaces are treated by the coating layer C.

Also, after the deposition process is performed a plurality of times, a process of cleaning the chamber and the structure or the component installed in the chamber is performed, and then a process of forming a coating layer is performed again.

More particularly, for example, a process of cleaning the wall member 112a of the chamber 100, the susceptor 600 on which the substrate S is seated, and the injection unit 500 for injecting a gas is performed. To this end, firstly, the wall member 112a, the susceptor 600, and the injection unit 500 are separated and unloaded from the chamber 100. Thereafter, each of the wall member 112a, the susceptor 600, and the injection unit 500, which are separated or unloaded, is cleaned by a wet cleaning method using a cleaning solution. Thereafter, the coating layer C is formed on the surface of each of the wall member 112a, the susceptor 600, and the injection unit 500, and then the wall member 112a, the susceptor 600, and the injection unit 500 are installed again in the chamber 100.

As described above, in accordance with an exemplary embodiment, the structure A of the substrate processing apparatus is formed by using a material to which another material is not adsorbed or not easily adsorbed and which is not chemically bonded with another material or does not react with another material, and the coating layer C is formed on the surface of the structure A exposed to the processing space. For example, the coating layer C may be formed on at least one of the inner surface of the chamber 100, the surface of the injection unit 500, and the surface of the susceptor 600.

Thus, although the structure A is exposed to the first gas (the source material) for depositing the thin-film, the first gas is not adsorbed or not easily adsorbed to the coating layer C and is not chemically bonded or does not react with the coating layer C as in FIG. 1. Also, the reactant between the first gas and the second gas is not adsorbed or not easily adsorbed to the coating layer and is not chemically bonded or does not react with the coating layer. Thus, deposition of the thin-film on the surface of the structure A may be restricted or prevented. Thus, as the substrate processing apparatus is provided by using the structure A including the above-described coating layer C, the deposition of the thin-film on the inner surface of the substrate processing apparatus exposed to the processing space 120 may be restricted or prevented.

In other words, as the coating layer C in accordance with an exemplary embodiment is formed on the surface of the structure or the component of the substrate processing apparatus, the deposition of the thin-film on the surface of the structure or the component may be restricted or prevented. For example, as the coating layer C in accordance with an exemplary embodiment is formed on at least one of the inner surface of the main body 110 of the chamber 100, the surface of the injection body 510, and the surface of the support body 610, the deposition of the thin-film may be restricted or prevented.

Also, the above-described coating layer C made of the polymer material is not dissociated or thermally decomposed at a temperature of 450° C. or less, and a bonding structure of the coating layer C is maintained. Thus, the structure A having the above-described coating layer C may be used as the structure or the component of the substrate processing apparatus for processing the substrate at the temperature of 450° C. or less. In other words, when the substrate processing process is performed at the temperature of 450° C. or less in the substrate processing apparatus applied with the structure A having the coating layer C in accordance with an exemplary embodiment, the coating layer C is not dissociated or thermally decomposed, and the bonding structure without the functional group of the hydroxyl group (—OH) and the amino group (—NH) at the end tail is maintained. Thus, another material, e.g., the material injected for depositing the thin-film, is not adsorbed to the coating layer C of the structure A or not chemically bonded or does not react with the coating layer C of the structure A during the substrate processing process.

Thus, the substrate processing apparatus applied with the structure in accordance with the exemplary embodiment may extend a period of cleaning the structure or the component such as the chamber 100, the susceptor 600, and the injection unit 500.

The substrate processing apparatus in accordance with the exemplary embodiment forms the coating layer in order to restrict or prevent the thin-film from being deposited on the surface of the structure or the component exposed or accommodated in the processing space in the chamber.

Thus, the generation of particles or substrate pollution caused by the thin-film deposited in the chamber may be restricted or prevented. Also the period of cleaning the chamber and the structure or the component in the chamber may be extended. Thus, the product yield rate and the apparatus operation efficiency may improve.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An apparatus for processing a substrate using a source material gas comprising at least one of aluminum (Al), titanium (Ti), and tin (Sn), and a reaction material gas comprising at least one of ozone ($O_3$), ammonia ($NH_3$), $H_2O$, hydrogen peroxide ($H_2O_2$), nitrous oxide ($N_2O$), and hydrogen ($H_2$), and depositing a thin-film by reaction between the source material gas and the reaction material gas on the substrate, the apparatus, comprising:
  a chamber having a processing space for depositing the thin-film on the substrate;
  a structure having at least one surface arranged within the processing space; and
  a coating layer made of a polymer forming at least one of covalent bond and double bond at an end tail formed on the surface arranged within the processing space,
  wherein the structure does not comprise the substrate, and
  wherein the coating layer is made of at least one of poly(methyl methacrylate) (PMMA), poly(tert-butyl methylacrylate) (PtBMA), poly(vinyl pyrrolidone) (PVP), poly(methyl methacrylamide) (PMAM), and polystyrene-block-poly(methyl methacrylate) (PS-b-PMMA).

2. The apparatus of claim 1, wherein the structure comprises a base made of at least one of metal and alloy and having at least one surface exposed to the processing space, and
  the coating layer is applied on the at least one surface exposed to the processing space in the surface of the base.

3. The apparatus of claim 1, wherein the chamber comprises a body having the processing space and a wall member mounted to and separated from an inner wall of the body,
  the structure comprises at least one of the wall member, a susceptor installed in the processing space and on which the substrate is seated, and an injection unit disposed to face the susceptor and configured to inject a material for depositing a thin-film toward the susceptor, and
  each of the wall member, the susceptor, and the injection unit is separated from the chamber to the outside.

4. The apparatus of claim 1, wherein when a thin-film is deposited on the substrate, an inner temperature of the chamber is adjusted to 450° C. or less.

5. The apparatus of claim 1, wherein the apparatus for processing the substrate deposits the thin-film on the substrate by an atomic layer deposition method (ALD).

6. A method for preparing an apparatus for processing a substrate using a source material gas comprising at least one of aluminum (Al), titanium (Ti), and tin (Sn), and a reaction material gas comprising at least one of ozone ($O_3$), ammonia ($NH_3$), $H_2O$, hydrogen peroxide ($H_2O_2$), nitrous oxide ($N_2O$), and hydrogen ($H_2$), and depositing a thin-film by reaction between the source material gas and the reaction material gas on the substrate arranged within a processing space of a chamber of the apparatus, the method comprising:
  forming a coating layer, which is made of a polymer forming one of covalent bond and double bond at an end tail, on at least one of a surface of the chamber exposed to the processing space and a surface of a component installed in the processing space,
  wherein the component installed in the processing space does not comprise the substrate, and
  wherein the coating layer is made of at least one of poly(methyl methacrylate) (PMMA), poly(tert-butyl methylacrylate) (PtBMA), poly(vinyl pyrrolidone) (PVP), poly(methyl methacrylamide) (PMAM), and polystyrene-block-poly(methyl methacrylate) (PS-b-PMMA.

7. The method of claim 6, wherein when the coating layer is formed, the coating layer is formed on at least one of a wall member of the chamber, which surrounds the processing space, a support body installed in the processing space and on which the substrate is seated, and an injection body disposed to face the support body to inject a material for depositing a thin-film toward the support body.

8. A method for processing a substrate in a chamber of an apparatus in which a coating layer, which is made of a polymer forming one of covalent bond and double bond at an end tail, is formed on at least one of a surface of a chamber exposed to a processing space and a surface of a component installed in the processing space in the chamber having the processing space in which a thin-film is deposited on a substrate, the method comprising:

depositing a thin-film on the substrate by loading a substrate into the processing space and injecting a material for a deposition process into the processing space, wherein the material for the deposition process comprises a source material gas and a reaction material gas, wherein the source material gas comprises at least one of aluminum (Al), titanium (Ti), and tin (Sn), and the reaction material gas comprises at least one of ozone ($O_3$), ammonia ($NH_3$), $H_2O$, hydrogen peroxide ($H_2O_2$), nitrous oxide ($N_2O$), and hydrogen ($H_2$), wherein the thin-film deposited on the surface is deposited by reaction between the source material gas and the reaction material gas, wherein the component installed in the processing space does not comprise the substrate, and wherein the coating layer is made of at least one of poly(methyl methacrylate) (PMMA), poly(tert-butyl methylacrylate) (PtBMA), poly(vinyl pyrrolidone) (PVP), poly(methyl methacrylamide) (PMAM), and polystyrene-block-poly(methyl methacrylate) (PS-b-PMMA).

9. The method of claim 8, wherein the depositing of the thin-film on the substrate is performed at a temperature of 450° C. or less by an atomic layer deposition method (ALD).

* * * * *